United States Patent
Boucheret et al.

(10) Patent No.: US 6,754,075 B2
(45) Date of Patent: Jun. 22, 2004

(54) MOTOR-FAN UNIT PARTICULARLY FOR A HEATING AND/OR AIR CONDITIONING APPARATUS FOR A MOTOR VEHICLE

(75) Inventors: Bernard Boucheret, Gennevilliers (FR); Stephane Talaucher, Bonnelles (FR); Pierre-Arnaud Geroux, Chatou (FR)

(73) Assignee: Valeo Climatisation, La Verriere (FR)

( * ) Notice: Subject to any disclaimer, the term of this patent is extended or adjusted under 35 U.S.C. 154(b) by 67 days.

(21) Appl. No.: 10/281,994

(22) Filed: Oct. 29, 2002

(65) Prior Publication Data

US 2003/0086242 A1 May 8, 2003

(30) Foreign Application Priority Data

Nov. 2, 2001 (FR) .............................. 01 14242

(51) Int. Cl.[7] .................................................. H05K 7/20
(52) U.S. Cl. .......................... 361/697; 165/121; 310/58; 310/64; 415/178; 454/184
(58) Field of Search ........................... 310/52, 58, 59, 310/62–64; 415/177, 178, 213.1, 214.1; 312/236; 454/184; 165/80.3, 121–126; 257/706, 707, 713, 722; 361/690, 692, 694, 695, 697, 703, 717–719

(56) References Cited

FOREIGN PATENT DOCUMENTS

| EP | 0 501 198 A1 | 9/1992 |
| EP | 0 652 375 A1 | 5/1995 |
| FR | 2 236 384 | 1/1975 |

*Primary Examiner*—G. Tolin
(74) *Attorney, Agent, or Firm*—Ronald Courtney

(57) ABSTRACT

The invention relates to a motor-fan unit (1) comprising a casing (10), a turbine (12) housed in the casing to generate an air flow therein, a motor (14) for driving the turbine, a support (20) for the motor, also forming a cover that closes off the casing on one side (10a) thereof, and a motor control module (30) associated with at least one radiator dissipating heat generated by components of the control module and exposed to the air flow generated in the casing.

The control module (30) is mounted on the motor support cover (20) on the outside thereof and the radiator is at least partially engaged through at least one opening made in the motor support cover and opening laterally into the casing.

13 Claims, 2 Drawing Sheets

MOTOR-FAN UNIT PARTICULARLY FOR A HEATING AND/OR AIR CONDITIONING APPARATUS FOR A MOTOR VEHICLE

BACKGROUND OF THE INVENTION

The invention relates to a motor-fan unit particularly for a heating and/or air conditioning apparatus, in particular for a motor vehicle.

For such an application, it is known practice to use a motor-fan unit of the type comprising a casing, a turbine housed in the casing to generate an air flow therein, a motor for driving the turbine, a support for the motor also forming a cover that closes off the casing on one side thereof, and a module for controlling the motor to allow the motor speed to be varied as needed.

One problem to be solved is that of cooling the motor control modules. It is known practice for one or more radiators to be associated with the control module for this purpose in order to dissipate the heat generated by the electrical and electronic components of this module. In particular, it has been proposed for the radiator or radiators to be exposed to the air flow generated in the casing, but by arranging the radiators at the casing outlet, which forces the components of the control module to be fairly distant from the motor that is to be controlled.

In addition, the presence of radiator fins penetrating into the air flow leaving the casing over a relatively great distance disturbs the flow and generates noise.

SUBJECT AND SUMMARY OF THE INVENTION

The purpose of the invention is to solve the problem of cooling the control module while at the same time maintaining the possibility of housing the module as maintaining the possibility of housing the module as close as possible to the motor, so as to reduce electrical connections and bulk, while at the same time allowing easy removal and easy refitting of the control module where necessary, and allowing this module to be cooled effectively.

This objective is achieved by virtue of a motor-fan unit of the type defined at the beginning of this description and in which the control module is mounted on the motor support cover on the outside thereof and the or each radiator for dissipating heat associated with the control module is at least partially engaged through at least one opening made in the motor support cover and opening laterally into the casing.

Thus, effective cooling can be obtained by exposing the radiator or radiators of the control module to the very turbulent air in the casing, while at the same time allowing easy removal and easy refitting of the control module because the latter, if need be, can be extracted from the motor-fan unit without the need to remove the motor support cover.

Advantageously, the control module comprises at least one radiator having several parts which are engaged through separate openings of corresponding shapes. Forming several openings, rather than a single opening which has necessarily to be larger, means that the rigidity of the motor support cover is not affected.

The or each radiator is engaged in at least one opening advantageously made in a region situated between an outer contour of the motor support cover and the central part of the latter situated facing the turbine. Thus, the or each radiator part projects laterally into the casing outside of the path of the turbine.

The distance by which the or each radiator part penetrates into the casing is therefore not limited by the need not to interfere with the turbine.

However, in order to avoid generating undesirable noise, this penetration distance may be relatively small, for example between 1 mm and 20 mm, preferably between 1 mm and 15 mm.

When the or each radiator penetrates at least partially by a short distance into the casing, or is even practically flush with the side thereof, a sufficient area for heat exchange with the air can be presented by increasing the dimensions, measured in the plane of the side of the casing, and thereby the dimensions of the opening or openings made in the motor support cover.

In a known way, the exchange area can also be increased by providing the or each radiator with reliefs of various shapes, such as ribs, for example curved, or pips.

Another subject of the invention is a heating and/or air conditioning apparatus comprising a motor-fan unit as defined hereinabove.

BRIEF DESCRIPTION OF THE DRAWINGS

The invention will be better understood from reading the description given hereinafter by way of nonlimiting indication, with reference to the appended drawings, in which.

DETAILED DESCRIPTION OF THE EMBODIMENTS OF THE INVENTION

One embodiment of the invention will be described hereinafter in the context of an application to a heating and/or air conditioning apparatus for a motor vehicle. A motor-fan unit according to the invention can, however, be used for other applications requiring the generation of a flow of air or some other gas.

Figure 1:
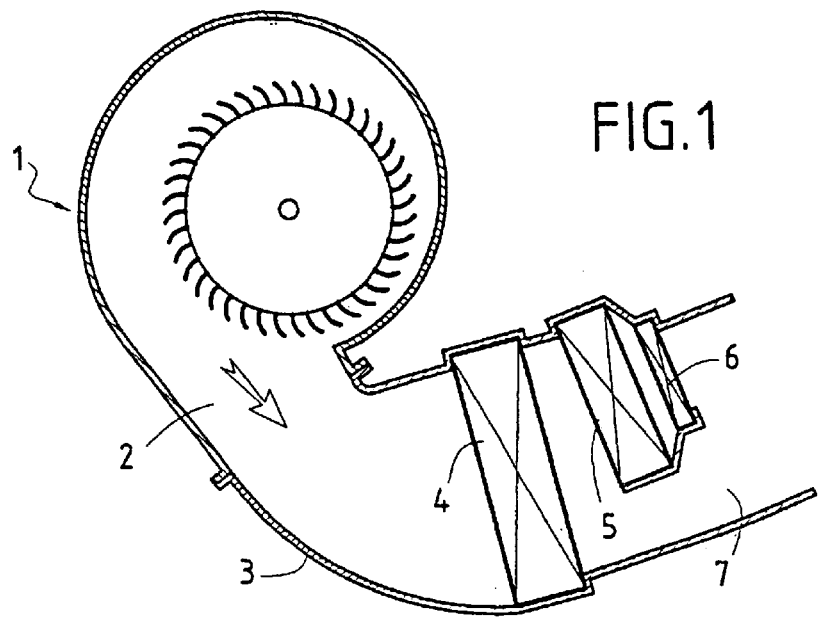
FIG. 1 is a highly schematic view of a heating and air conditioning apparatus for a motor vehicle.

FIG. 1 provides a highly schematic depiction of a heating and air conditioning apparatus which comprises, in a very well-known way, a motor-fan unit 1, or blower, delivering an air flow 2 to a duct 3. Arranged in the latter are an evaporator 4 of a refrigeration circuit (when the air conditioning function is present), an air-liquid heat exchanger radiator 5 through which the vehicle engine coolant flows and possibly an electric top-up radiator 6. In air conditioning mode, air is diverted into a passage 7 bypassing the radiator 5. Downstream of the radiators 5 and 6, the duct 3 distributes the air to the outlets into the vehicle cabin. The air is distributed and possibly mixed via controlled shutters (not depicted).

The motor-fan unit 1 comprises (FIGS. 1 to 3) a casing 10 inside which a turbine 12 is housed. On one of its sides 10a, the casing has an opening closed off by a cover 20 forming a support for a motor 14 for driving the turbine 12. The motor 14 (shown schematically in chain line in FIGS. 2 and 3) and the turbine 12 are coaxial. The turbine is mounted by a radial arms 12a on the output shaft 14a of the motor 14. The support 20 delimits the housing 22 for the motor which projects laterally on the side 10a of the casing. The side of the casing opposite to the side 10a has a central air intake opening. The air taken in and circulated by the turbine is extracted from the casing 10 by an outlet 10c connected to the duct 3.

In a motor-fan unit according to the invention, a motor control module 30, which allows the motor to be driven at a rotational speed that can vary according to the desired air flow rate to leave the casing, is mounted on the motor support cover 20, on the outside thereof.

More specifically, the module 30 is mounted on a part of a rim 24 of the motor support cover which surrounds the opening of the motor housing 22. The rim 24 has a circular contour 24a which fits the lateral opening formed on the side 10a of the casing. This opening is closed off for example by a "quarter-turn" or bayonet-type mounting of the motor support cover 20 on the side 10a of the casing.

Advantageously, the axis of the motor housing 22 (which is coincident with the axis of the motor and of the turbine) is offset with respect to that of the contour 24a of the motor support cover. As a result, the rim 24 has a variable width and the module 30 is mounted in the wider region 26 of the rim 24. Sufficient space is thus left for mounting the module 30, while at the same time limiting the overall bulk.

The motor 14 is mounted on the motor support cover 20 by screws or screw-nut assemblies 27 passing through fixing blocks 25 formed by pressed parts of the rim 24 in which parts mounting lugs of the motor are housed.

Figure 4:
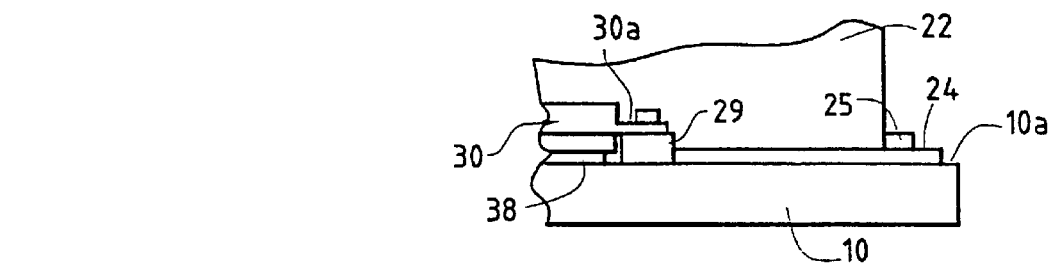
FIG. 4 is a highly schematic perspective view showing the motor support cover and the turbine of the motor-fan unit of FIG. 2.

The control module 30 comprises a printed circuit board (not depicted) supporting a collection of electrical and electronic components and connectors 31 to receive a supply voltage and motor speed control signals and to deliver the necessary supply to the motor. To simplify matters, the connections entering and leaving the control module and the motor have not been depicted. FIG. 4 does, however, show that the control module 30 is fitted with a cover 34 which covers the printed circuit board and the components borne thereby, and which is fixed to a radiator 36 on which the printed circuit board and the components borne thereby are arranged.

The radiator 36 comprises projecting parts such as blocks or fins 38 on its lower face, the blocks or fins 38 are engaged in openings 28 of the part of the rim 24 to which the module 30 is fixed. In the example illustrated, the blocks 38 have a cross section roughly in the shape of annulus sectors, the openings 28 having corresponding shapes.

The openings 28 are formed in a region of the rim 24 that is situated between the contour 24a and the central part of the motor support cover situated facing the turbine 12. Thus, the openings 28 open laterally into the casing 10 outside the path of the turbine (the boundary 12a of the path of the turbine is shown in broken line in FIG. 2).

Of course, the number and shape of the blocks or fins 38 may vary without departing from the scope of the invention. It may be envisioned for the radiator 36, whether or not fitted with blocks or fins, to be engaged through an opening that hugs its perimeter. However, because of its size, there is a risk that such an opening might affect the rigidity of the motor support cover 20. That is why the making of several openings 28 of smaller size, through which projecting parts of the radiator engage is preferred. This is because the rigidity of the motor support cover is then preserved by the strips of material 28a forming spacer pieces separating the openings from each other.

It will also be noted that the control module may be equipped with several separate radiators at its lower part. Depending on the side of these radiators, they may be fully engaged or partially engaged by reliefs or fins formed at their lower face, in openings in the motor support cover.

The control module 30 is fixed for example by means of screws 32 which pass through lugs 30a at the ends of the module and screw into blocks 29 formed integrally with the motor support cover 20.

Thus, in the event of failure, the control module 30 can easily be removed from the motor-fan unit because having removed the screws 32, it can be extracted without the need to remove the motor support cover. It is just as easy to refit a control module.

The blocks or fins 38 of the radiator which penetrate into the casing 10 lie outside the path of the turbine 12, near the periphery of the casing, and cannot interfere with the turbine when it is turning.

Figure 2:
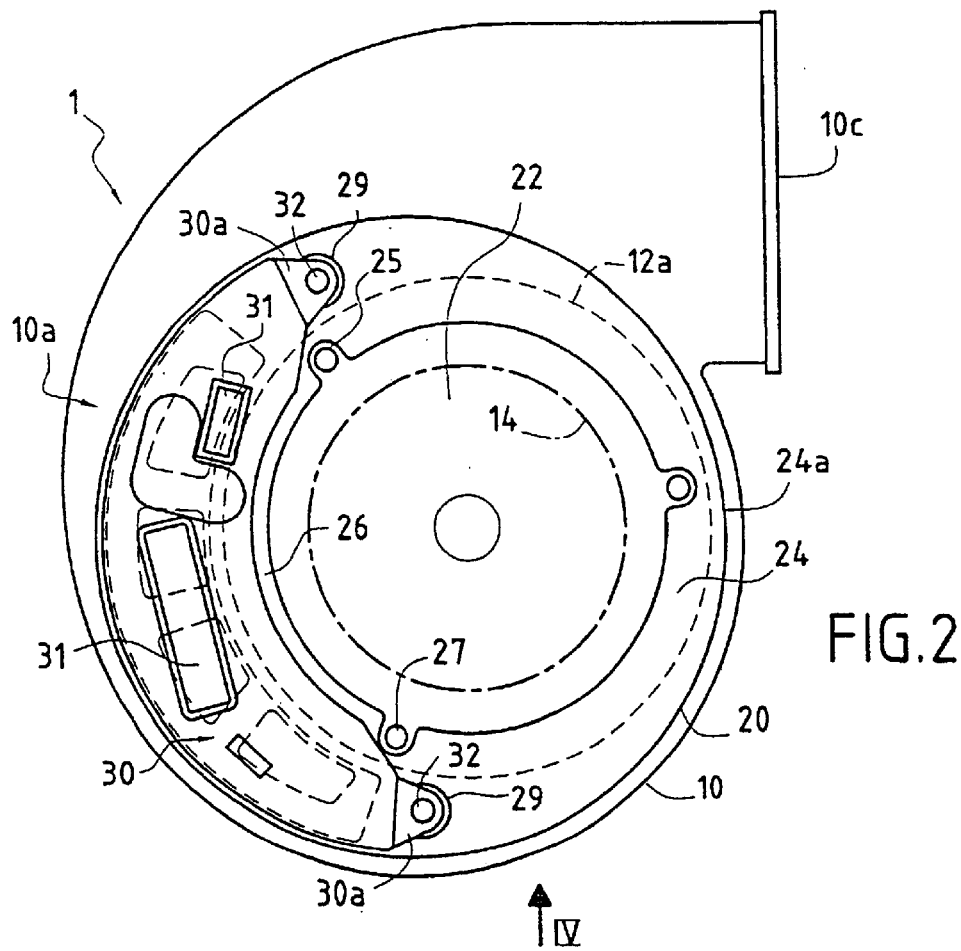
FIG. 2 is an elevation of the motor-fan unit according to one embodiment of the invention.
Figure 3:
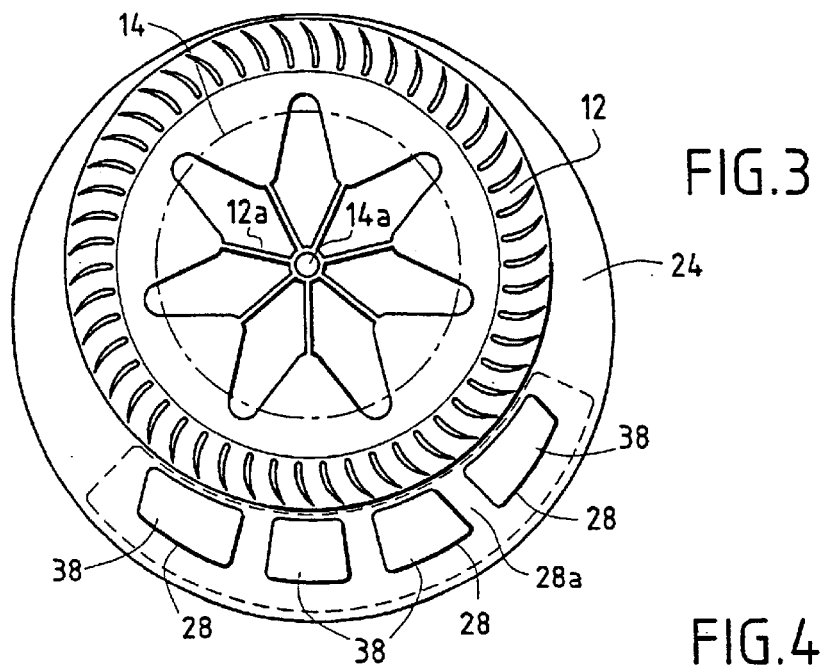
FIG. 3 is a partial side view of the motor-fan unit of FIG. 2.

However, in order to avoid generating undesirable noise, it is preferable for the penetration of the blocks or fins 38 into the casing to be limited. A penetration distance from 1 mm to 20 mm, or even from 1 mm to 15 mm is preferable. Even when the blocks or fins 38 are practically flush with the side of the casing, satisfactory exchange of heat with the air may be afforded because of the turbulence in the casing; as FIG. 2 shows, the region in which the module 30 is mounted can be situated very much upstream of the casing outlet, at which outlet the air flow is less turbulent. The region 26 of the rim 24 in which the openings 28 are formed has a central angular position which is offset preferably by at least 90° upstream with respect to the casing outlet, and this places the module of the radiator in the region of greatest turbulence of the casing and thus considerably improves its cooling.

In spite of a small penetration into the casing, the blocks or fins 38 can individually or overall have sufficient dimensions, measured in the plane of the side 10a of the casing, to offer a large exchange area, the openings 28 being sized accordingly.

In a way known per se, an increase in the exchange area can be obtained by forming special reliefs on the blocks or fins 38.

Figure 5:
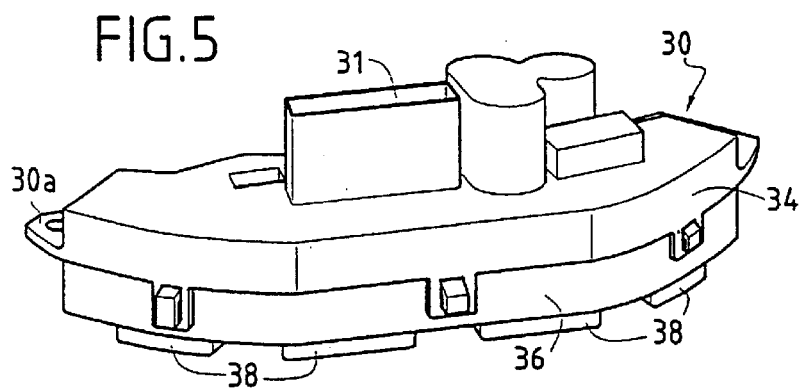
FIG. 5 is a highly schematic perspective view on a larger scale showing the motor control module of the motor-fan unit of FIG. 2.
Figures 6, 7:
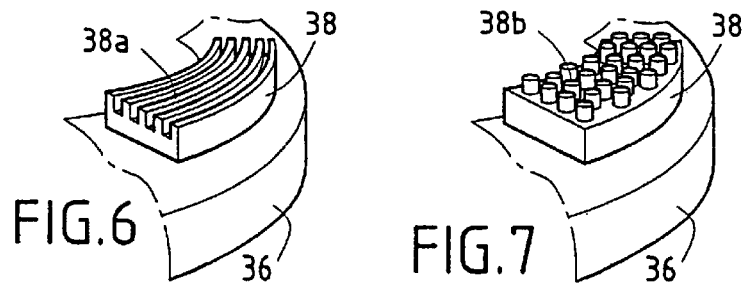
FIGS. 6 and 7 are detailed views on a larger scale showing alternative forms of embodiment of the radiators of the motor control module in a motor-fan unit such as that of FIGS. 2 to 5.

FIGS. 5 and 6, figure shows blocks or fins 38 which, at their end face, have ribs 38a of curved shape, which are roughly aligned with the overall direction in which the air flows in the casing, so as to limit the disruption occasioned to this flow.

According to another alternative form shown in FIG. 7, the blocks or fins 38 have, on the external face, reliefs in the form of pipe 38b, arranged, for example, in a staggered configuration.

What is claimed is:

1. A motor-fan unit comprising a casing, a turbine housed in the casing to generate an air flow therein, a motor for driving the turbine, a support for the motor, also forming a cover that closes off the casing on one side thereof, and a motor control module associated with at least one radiator dissipating heat generated by components of the control module and exposed to the air flow generated in the casing, wherein the control module is mounted on the motor support cover on the outside thereof and the radiator is at least partially engaged through at least one opening made in the motor support covet and opening laterally into the casing.

2. The motor-fan unit as claimed in claim 1, wherein the control module comprises at least one radiator having several parts which project at an external surface of the radiator and which are engaged in separate openings formed in the motor support cover and wherein the control module is fitted with a cover which is fixed to the at least one radiator.

3. The motor-fan unit as claimed in claim 1, wherein the at least one radiator is at least partially engaged in at least one opening made in a region situated between an outer contour of the motor support cover and a central part of the latter situated facing the turbine.

4. The motor-fan unit as claimed in claim 3, wherein the distance by which at least part of the or each radiator penetrates into the casing is between 1 mm and 20 mm.

5. The motor-fan unit as claimed in claim 4, wherein said penetration distance is between 1 mm and 15 mm.

6. The motor-fan unit as claimed in claim 1, wherein the control module is mounted in a region of a rim of the motor support cover surrounding a housing for the motor.

7. The motor-fan unit as claimed in claim 6, wherein the rim has a circular contour with a center which is offset with respect to the axis of the motor and of the motor housing, and the module is mounted in the wider region of the rim.

8. The motor-fan unit as claimed in claim 6, wherein the region of the rim has a central angular position that is offset by at least 90° upstream with respect to the casing outlet.

9. The motor-fan unit as claimed in claim 1, wherein each radiator part engaged through an opening in the motor support cover bears reliefs on its end face.

10. The motor-fan unit as claimed in claim 9, wherein said reliefs are curved ribs.

11. The motor-fan unit as claimed in claim 10, wherein said ribs are roughly aligned with the overall direction in which the air flows in the casing.

12. The motor-fan unit as claimed in claim 9, wherein said reliefs are pips.

13. A heating and/or air conditioning apparatus which comprises a motor-tin unit as claimed in claim 1 connected to a duct equipped with at least one device for heating or cooling air.

* * * * *

UNITED STATES PATENT AND TRADEMARK OFFICE
CERTIFICATE OF CORRECTION

PATENT NO. : 6,754,075 B2  
DATED : June 22, 2004  
INVENTOR(S) : Boucheret et al.

It is certified that error appears in the above-identified patent and that said Letters Patent is hereby corrected as shown below:

<u>Column 6,</u>
Line 17, replace "a motor-tin unit" with -- a motor-fan unit --

Signed and Sealed this

Fifth Day of July, 2005

JON W. DUDAS
*Director of the United States Patent and Trademark Office*